United States Patent
Jayapal

(10) Patent No.: US 9,813,047 B2
(45) Date of Patent: Nov. 7, 2017

(54) STANDBY MODE STATE RETENTION LOGIC CIRCUITS

(71) Applicant: MediaTek Singapore Pte. Ltd., Singapore (SG)

(72) Inventor: Senthilkumar Jayapal, Singapore (SG)

(73) Assignee: MediaTek Singapore Pte. Ltd., Singapore (SG)

(*) Notice: Subject to any disclaimer, the term of this patent is extended or adjusted under 35 U.S.C. 154(b) by 0 days.

(21) Appl. No.: 14/984,020

(22) Filed: Dec. 30, 2015

(65) Prior Publication Data

US 2016/0301396 A1    Oct. 13, 2016

Related U.S. Application Data

(60) Provisional application No. 62/146,537, filed on Apr. 13, 2015.

(51) Int. Cl.
*H03K 3/356* (2006.01)
*H03K 3/012* (2006.01)
*H03K 3/037* (2006.01)

(52) U.S. Cl.
CPC ....... *H03K 3/356008* (2013.01); *H03K 3/012* (2013.01); *H03K 3/0375* (2013.01)

(58) Field of Classification Search
CPC .............................................. H03K 3/356008
USPC .................................................. 327/143, 212
See application file for complete search history.

(56) References Cited

U.S. PATENT DOCUMENTS

| 6,097,228 A * | 8/2000 | Fujisawa ................... G06F 1/24 327/142 |
| 7,391,250 B1 * | 6/2008 | Chuang ................ H03K 3/0375 326/104 |
| 7,639,056 B2 | 12/2009 | Gururajarao et al. ........ 327/202 |
| 8,253,438 B2 | 8/2012 | Hoberman et al. ............. 326/27 |
| 2010/0308876 A1 | 12/2010 | Kawasaki et al. ............ 327/143 |
| 2011/0248759 A1 | 10/2011 | Chi et al. ...................... 327/202 |
| 2011/0298516 A1 | 12/2011 | Pal .............................. 327/202 |
| 2017/0016955 A1* | 1/2017 | Kim ................... G01R 31/3177 |

OTHER PUBLICATIONS

Hamid Mahmoodi-Meimand et al., "Data-Retention Flip-Flops for Power-Down Applications", IEEE International Symposium on Circuits and Systems (ISCAS), pp. II-677 to II-680, (2004).

* cited by examiner

*Primary Examiner* — Lincoln Donovan
*Assistant Examiner* — Metasebia Retebo
(74) *Attorney, Agent, or Firm* — Imperium Patent Works; Thomas Wallace

(57) ABSTRACT

A retention mode sequential logic circuit has no balloon latch, and all its P-channel transistors are disposed in a single N-well. In one example, the circuit is a retention flip-flop that has an active high retention signal input and an active low reset input. In another example, the circuit is a retention flip-flop that has an active low retention signal input and an active low reset input. In a multi-bit retention register example, one common clock and reset signal generation logic circuit drives multiple pairs of latches. Each retention mode logic circuit described has a low transistor count, is implemented with a single N-well, exhibits low retention mode power consumption, is not responsive to a reset signal in the retention mode, and has a fast response time when coming out of retention mode operation.

10 Claims, 10 Drawing Sheets

CIRCUIT DIAGRAM OF STATE RETENTION FLIP-FLOP WITH ACTIVE LOW RETENTION SIGNAL AND ACTIVE LOW RESET

SYMBOL OF STATE RETENTION FLIP-FLOP WITH ACTIVE
HIGH RETENTION SIGNAL AND ACTIVE LOW RESET

CIRCUIT DIAGRAM OF STATE RETENTION FLIP-FLOP WITH
ACTIVE HIGH RETENTION SIGNAL AND ACTIVE LOW RESET

INVERTER SYMBOL AND THE REPRESENTED CIRCUIT

NOR GATE SYMBOL AND THE REPRESENTED CIRCUIT

NAND GATE SYMBOL AND THE REPRESENTED CIRCUIT

TRI-STATABLE INVERTER SYMBOL AND THE
REPRESENTED CIRCUIT

TRI-STATABLE INVERTER HAVING DISABLE
SYMBOL AND THE REPRESENTED CIRCUIT

| SLEEP MODE SCENARIO WTIH 8KB RETENTION | | | |
|---|---|---|---|
| | SRAM RETENTION (PRIOR ART) | CIRCUIT OF FIG. 2 (W/ TWO N-WELLS) | CIRCUIT OF FIG. 2 (W/ SINGLE N-WELL) |
| NUMBER OF TRANSISTORS | 6.0 | 36.0 | 36.0 |
| RESPONSE TIME (COMING OUT OF RETENTION MODE) (ms) | 1.33 | 0.92 | 0.92 |
| ACTIVE MODE POWER AT 1.2V (uW) | - | 1.03 | 1.03 |
| RETENTION MODE POWER AT 0.75V (pW) | 5.38 | 4.2 | 4.42 |
| CLK-TO-Q TIMING AT 1.2V (pS) | - | 142.65 | 142.65 |
| PHYSICAL AREA ($\mu m^2$ WHEN IMPLEMENTED IN 55nm CMOS) | 0.81 | 15.83 | 7.59 |

CHARACTERISTICS OF THE RETENTION FLIP-FLOP OF FIG. 2

FIG. 8

OPERATION OF THE STATE RETENTION FLIP-FLOP OF FIG. 2

N-WELL AND POLYSILICON

HORIZONTAL METAL

VERTICAL METAL

HORIZONTAL METAL, VERTICAL
METAL, AND VIAS BETWEEN
METAL LAYERS

SIMPLIFIED CROSS-SECTIONAL VIEW
ALONG LINE A-A' OF FIG. 10A

SYMBOL OF STATE RETENTION
FLIP-FLOP WITH ACTIVE LOW
RETENTION SIGNAL AND
ACTIVE LOW RESET

SYMBOL OF MULTI-BIT REGISTER WITH
STATE RETENTION FLIP-FLOPS,
ACTIVE HIGH RETENTION SIGNAL, AND
ACTIVE LOW RESET

CIRCUIT DIAGRAM OF STATE RETENTION FLIP-FLOP WITH
ACTIVE LOW RETENTION SIGNAL AND ACTIVE LOW RESET

CIRCUIT DIAGRAM OF A MULTI-BIT REGISTER WITH STATE RETENTION FLIP-FLOPS, ACTIVE HIGH RETENTION SIGNAL AND ACTIVE LOW RESET

STANDBY MODE STATE RETENTION LOGIC CIRCUITS

CROSS REFERENCE TO RELATED APPLICATION

This application claims the benefit under 35 U.S.C. 119 from provisional U.S. patent application Ser. No. 62/146,537, entitled "Standby Mode State Retention Logic Circuits", filed on Apr. 13, 2015. This application incorporates by reference the entire contents of provisional U.S. patent application Ser. No. 62/146,537.

TECHNICAL FIELD

The described embodiments relate to state retention logic circuits and to related structures and methods.

BACKGROUND INFORMATION

Numerous state retention flip-flop architectures exist. Examples are set forth in: "Data-Retention Flip-Flops For Power-Down Applications", by Hamid Mahmoodi-Meimand et al., IEEE International Symposium on Circuits and Systems (ISCAS), pages II-677 to II-680, (2004); U.S. Pat. No. 8,253,438, entitled "Low Leakage And Data Retention Circuitry"; and U.S. Patent Publication Number 2011/0298516, entitled "Clock State Independent Retention Master-Slave Flip-Flop." Retention flip-flops and latches often have an extra balloon latch circuit. The balloon latch circuit stores the logic state of the flop-flop or latch when the flip-flop or latch is in the retention mode. At the end of retention mode operation, when the flip-flop or latch is to operate in the normal active mode again, the logic state information stored in the balloon latch circuit is loaded back into the primary latch of the device. For various reasons, realizing such a retention mode flip-flop or latch generally involves an undesirably large amount of semiconductor die area. Other retention mode devices have been proposed that do not involve extra balloon latches. Examples include devices set forth in: U.S. Pat. No. 7,639,056, entitled "Ultra Low Area Overhead Retention Flip-Flop For Power-Down Applications"; U.S. Patent Publication Number 2011/0248759, entitled "Retention Flip-Flop"; and U.S. Patent Publication Number 2010/0308876, entitled "Semiconductor Integrated Circuit And Method Of Saving And Recovering Internal State Thereof".

SUMMARY

In a first novel aspect, a state retention logic circuit comprises, in addition to other circuit components, a clock signal input node CK, a retention signal input node RT, a reset signal input node RN, a first data input node D1, a first data output node Q1, a first inverter, a second inverter, a pulldown N-channel transistor, a gate circuit, a first latch and a second latch. The first inverter has an input lead and an output lead. The input lead of the first inverter is coupled to the clock signal input node CK. The first inverter outputs a second clock signal CN onto the output lead of the first inverter. The second inverter has an input lead and an output lead. The input lead of the second inverter is coupled to the output lead of the first inverter. The second inverter outputs a first clock signal C onto the output lead of the second inverter. The pulldown N-channel transistor has a source coupled to a ground node, a drain coupled to the clock signal input node CK, and a gate coupled to the retention signal input node RT. The gate circuit has a first input lead, a second input lead, and an output lead. The first input lead of the gate circuit is coupled to the retention signal input node RT. The second input lead of the gate circuit is coupled to the reset signal input node RN. The gate circuit outputs a reset signal RS onto the output lead of the gate circuit. The first latch has an input lead and an output lead. The input lead of the first latch is coupled to receive a data signal from the first data input node D1. The first latch is clocked by the first clock signal C and the second clock signal CN. The second latch has an input lead and an output lead. The input lead of the second latch is coupled to the output lead of the first latch. The output lead of the second latch is coupled to output a data signal onto the first data output node Q1. The second latch is clocked by the first clock signal C and the second clock signal CN. The second latch further comprises a gate and a tri-statable feedback element. The gate has a first input lead, a second input lead, and an output lead. The tri-statable feedback element has an input lead and an output lead. The input lead of the tri-statable feedback element is coupled to the output lead of the gate. The output lead of the tri-statable feedback element is coupled to the first input lead of the gate. The tri-statable feedback element is enabled and disabled by the first clock signal C and the second clock signal CN. The first inverter, the gate of the second latch, and the tri-statable feedback element of the second latch are all powered by a second supply voltage VSUP2. The second inverter and the first latch are powered by a first supply voltage VSUP1.

Asserting an active high retention signal onto the retention signal input node RT puts the state retention logic circuit into a retention mode. When in the retention mode, even if the first supply voltage VSUP1 is not supplied to the state retention logic circuit, the state retention logic circuit still retains its stored logic state provided that the VSUP2 supply voltage is still supplied. Asserting the active low reset signal on the reset input node RN when the state retention logic circuit is in the retention mode has no effect on the stored logic state and does not cause the state retention logic circuit to be reset. When not in the retention mode (when the state retention logic circuit is operating in its active state), asserting the active low reset signal on the reset input node RN causes the state retention logic circuit to be asynchronously reset. In one example, the state retention logic circuit has no extra balloon latch. The state retention logic circuit has only one N-well, and all P-channel transistors of the state retention logic circuit are disposed on this one N-well.

In a second novel aspect, the clock and reset signal generation logic of the state retention logic circuit drives both the first and second latches, as well as at least one additional pair of latches. Each latch pair has a data input terminal and a data output terminal. The overall state retention logic circuit is therefore a multi-bit register that has an incoming active high retention signal terminal RT and an incoming active low reset signal terminal RN.

In a third novel aspect, a state retention logic circuit comprises, in addition to other circuit components, a clock signal input node CK, a retention signal input node RTN, a reset signal input node RN, a first data input node D1, a first data output node Q1, a first gate, a first inverter, a second inverter, a third inverter, a pullup P-channel transistor, a first latch and a second latch. The first gate has a first input lead, a second input lead, and an output lead. The first input lead of the first gate is coupled to the clock signal input node CK. The second input lead of the first gate is coupled to the retention signal input node RTN. The first gate outputs a second clock signal CN onto the output lead of the first gate.

The first inverter has an input lead and an output lead. The input lead of the first inverter is coupled to the output lead of the first gate. The first inverter outputs a first clock signal C onto the output lead of the first inverter. The second inverter has an input lead and an output lead. The input lead of the second inverter is coupled to the reset signal input node RN. The third inverter has an input lead and an output lead. The input lead of the third inverter is coupled to the output lead of the second inverter. The third inverter outputs a reset signal RS onto the output lead of the third inverter. The pullup P-channel transistor has a source coupled to a VSUP1 supply voltage node and a drain coupled to the input lead of the third inverter. The first latch has an input lead and an output lead. The input lead of the first latch is coupled to receive a data signal from the first data input node D1. The first latch is clocked by the first clock signal C and the second clock signal CN. The second latch has an input lead and an output lead. The input lead of the second latch is coupled to the output lead of the first latch. The output lead of the second latch is coupled to output a data signal onto the first data output node Q1. The second latch is clocked by the first clock signal C and the second clock signal CN. The second latch further comprises a second gate and a tri-statable feedback element. The second gate has a first input lead, a second input lead, and an output lead. The tri-statable feedback element has an input lead and an output lead. The input lead of the tri-statable feedback element is coupled to the output lead of the second gate. The output lead of the tri-statable feedback element is coupled to the first input lead of the second gate. The tri-statable feedback element is enabled and disabled by the first clock signal C and the second clock signal CN. The first inverter, the third inverter, the second gate of the second latch, and the tri-statable feedback element of the second latch are all powered by a second supply voltage VSUP2. The first latch is powered by a first supply voltage VSUP1.

Asserting an active low retention signal onto the retention signal input node RT puts the state retention logic circuit into a retention mode. When in the retention mode, even if the first supply voltage VSUP1 is not supplied to the state retention logic circuit, the state retention logic circuit still retains its stored logic state provided that the VSUP2 supply voltage is still supplied. Asserting the active low reset signal on the reset input node RN when the state retention logic circuit is in the retention mode has no effect on the stored logic state and does not cause the state retention logic circuit to be reset. When not in the retention mode (when the state retention logic circuit is operating in its active state), asserting the active low reset signal on the reset input node RN causes the state retention logic circuit to be asynchronously reset. In one example, the state retention logic circuit has no extra balloon latch. The state retention logic circuit has only one N-well, and all P-channel transistors of the state retention logic circuit are disposed on this one N-well.

In a fourth novel aspect, the clock and reset signal generation logic of the state retention logic circuit drives both the first and second latches, as well as at least one additional pair of latches. Each latch pair has a data input terminal and a data output terminal. The overall state retention logic circuit is therefore a multi-bit register that has an incoming active low retention signal terminal RTN and an incoming active low reset signal terminal RN.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 8 is a table that sets forth characteristics of the retention flip-flop 1 of FIG. 2.

DETAILED DESCRIPTION

Reference will now be made in detail to background examples and some embodiments of the invention, examples of which are illustrated in the accompanying drawings.

Figure 1:
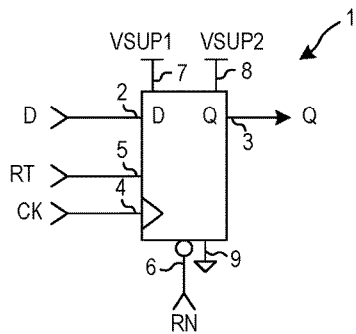
FIG. 1 is a symbol of a state retention flip-flop 1 that has an active high retention signal input RT and an active low asynchronous reset signal input RN in accordance with a first novel aspect.

FIG. 1 is a symbol of a state retention flip-flop 1 having an active high retention signal input and an active low asynchronous reset signal input. Of importance, the flip-flop 1 has a reduced transistor count, exhibits low power consumption in the retention mode, has a fast response time coming out of the retention mode, has only one N-well (all P-channel transistors of the flip-flop are disposed on this N-well), and has no balloon latch.

The symbol has a data input lead and node D 2, a data output lead and node Q 3, a clock signal input lead and node CK 4, an active high retention signal input lead and node RT 5, an active low asynchronous reset signal input lead and node RN 6, a first supply voltage input lead and node VSUP1 7, a second supply voltage input lead and node VSUP2 8, and a ground lead and node 9. The flip-flop is clocked on the rising edges of a clock signal received on the clock signal input lead CK 4. The flip-flop can be asynchronously reset by applying a logic level low reset signal onto the active low reset signal input lead RN 6 provided that the flip-flop is powered by both the supply voltages VSUP1 and VSUP2 and that the flip-flop is not operating in a retention state. The retention state is also referred to as the retention mode of operation. If the flip-flop is fully powered by both VSUP1 and VSUP2 supply voltages (for example, both VSUP1 and VSUP2 are 1.2 volts) and if the retention signal on the RT input lead 5 is at a digital logic low level, then the flip-flop is said to be in the active state. The active state is also referred to as the active mode of operation.

On the other hand, if the retention signal on the state retention signal input lead RT 5 is at a digital logic high level, then the flip-flop is in the retention state (is not in the active state). If the flip-flop is in the retention state, then the flip-flop need not be receiving power via the VSUP2 supply voltage input lead 8. The second supply voltage VSUP2 may be referred to as an "always on" supply voltage because typically it is always being supplied to the circuit, even if the first supply voltage VSUP1 is not being supplied and the flip-flop is in the retention state. An external voltage supply circuit (not shown) that supplies the first VSUP1 supply voltage to the flip-flop during the active state via input lead 7 can effectively be disconnected from the flip-flop in the retention mode so that the voltage on the VSUP1 supply voltage input lead 7 drops to zero volts. An external voltage supply circuit (not shown) that supplies the second VSUP2 supply voltage to the flip-flop via input lead 8 can reduce the second supply voltage VSUP2 from its higher nominal voltage (for example, 1.2 volts) used during the active mode to a reduced voltage (for example, 0.75 volts) used during the retention mode. The flip-flop is said to be "powered by" VSUP1 and is said to be "powered by" VSUP2. This "powered by" terminology describes, in one specific example, powering of the flip-flop by one or more external voltage supply circuits, where those external voltage supply circuits cause the supply voltages, as described above in the active mode and in the retention mode, to be present on the input leads and conductors 7 and 8.

When the flip-flop is in the retention state, the digital logic state stored by the flip-flop cannot be changed, either due to a rising edge of a clock signal received onto the clock signal input lead CK 4 or due to a reset signal on the asynchronous reset signal input lead RN 6 being asserted low.

Figure 2:
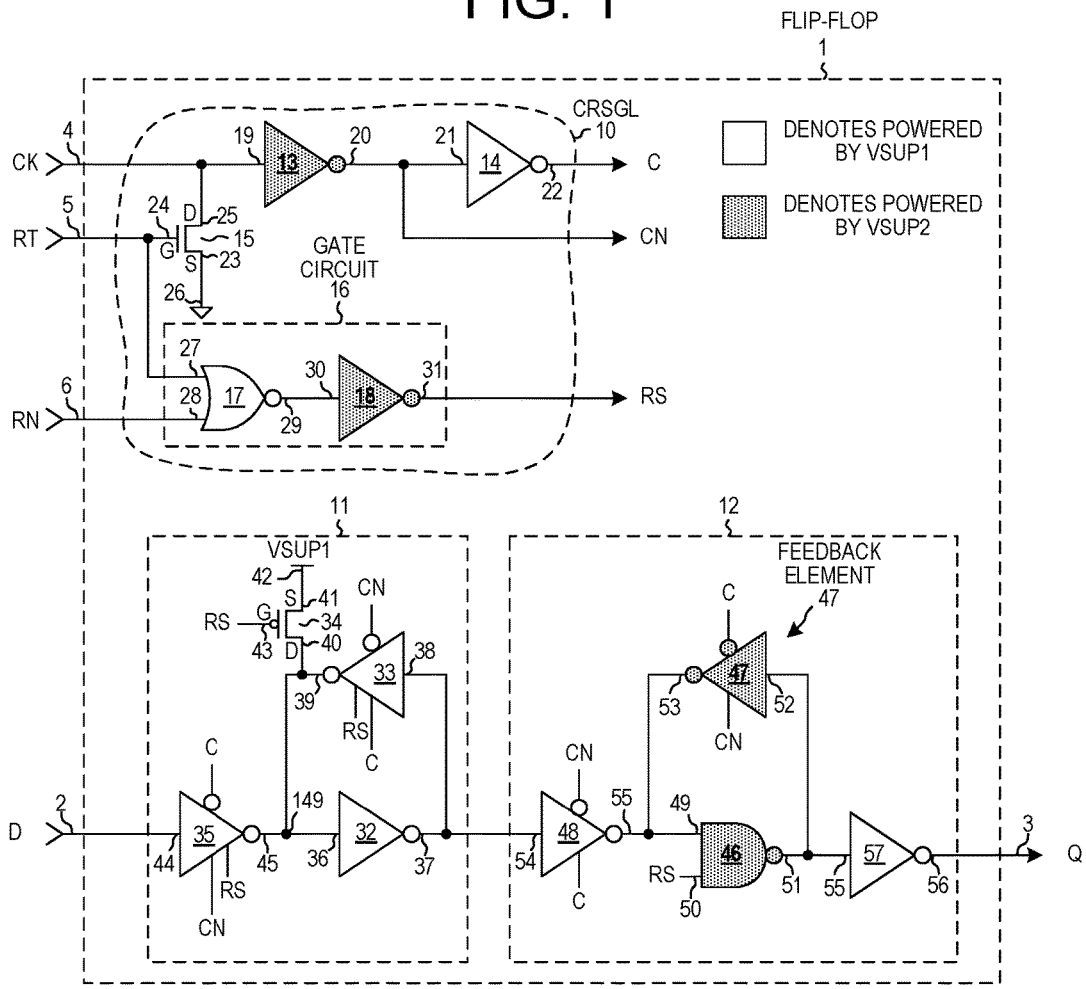
FIG. 2 is a circuit diagram of the retention flip-flop 1 of FIG. 1.

FIG. 2 is a circuit diagram of the retention flip-flop 1. The flip-flop 1 includes "Clock and Reset Signal Generation Logic" (CRSGL) circuit 10 as well as a first latch 11 and a second latch 12. CRSGL circuit 10 includes a first inverter 13, a second inverter 14, an N-channel pulldown transistor 15, and a gate circuit 16. The gate circuit 16 includes a NOR gate 17 and a third inverter 18. The first inverter 13 has an input lead 19 and an output lead 20. The input lead of the first inverter is coupled to the clock signal input lead CK 4 of the flip-flop. The first inverter outputs a second clock signal CN onto the output lead 20 of the first inverter. The second inverter 14 has an input lead 21 and an output lead 22. The input lead of the second inverter is coupled to the output lead of the first inverter. The second inverter outputs a first clock signal C onto the output lead 22 of the second inverter. The pulldown N-channel transistor 15 has a source lead or terminal 23, a gate lead or terminal 24 and a drain lead or terminal 25. The source lead or terminal 23 is coupled to a ground node and conductor 26. The drain lead or terminal 25 is coupled to the input lead 19 of the first inverter. The gate lead or terminal 24 is coupled to the retention signal input lead RT 5 of the flip-flop. The NOR gate 17 has a first input lead 27, a second input lead 28, and an output lead 29. The first input lead of the NOR gate is coupled to the retention signal input lead RT of the flip-flop. The second input lead of the NOR gate is coupled to the reset input lead RN of the flip-flop. The third inverter 18 has an input lead 30 and an output lead 31. The input lead 30 of the third inverter 18 is coupled to the output lead 29 of the NOR gate. The third inverter 18 outputs an internal reset signal RS onto its output lead 31.

The first latch 11 includes an inverter 32, a first tri-statable inverter 33, a pullup P-channel transistor 34, and a second tri-statable inverter 35. The first inverter 32 has an input lead 36 and an output lead 37. The first tri-statable inverter 33 has an input lead 38 and an output lead 39. The output lead 37 of the first inverter 32 is coupled to the input lead 38 of the first tri-statable inverter 33. The output lead 39 of the first tri-statable inverter 33 is coupled to the input lead 36 of the first inverter 32. The pullup P-channel transistor 34 has a drain lead or terminal 40 that is coupled to the output lead 39 of the first tri-statable inverter 33. A source lead or terminal 41 of the pullup P-channel transistor 34 is coupled to a VSUP1 supply voltage node and conductor 42. The gate lead or terminal 43 of the pullup P-channel transistor 34 is coupled to receive the internal reset signal RS from the output lead 31 of the third inverter 18. The second tri-statable inverter 35 has an input lead 44 and an output lead 45. The input lead 44 is coupled to the D input lead 2 and the output lead 45 is coupled to the input lead 36 of the inverter 32.

In one example, each of the first tri-statable inverter 33 and the second tri-statable inverter 35 has two and only two P-channel transistors. Neither the first tri-statable inverter 33 nor the second tri-statable inverter 35 has any P-channel transistor whose gate is coupled to receive the internal reset signal RS. There is only one P-channel transistor coupled to node 149 whose gate is coupled to receive the internal reset signal RS, and that P-channel transistor is pullup P-channel transistor 34. This aspect of the first latch 11 reduces transistor count of the overall flip-flop 1.

The second latch 12 includes a gate 46, a tri-statable feedback element 47, a tri-statable inverter 48, and an output inverter 57. In one example, the gate 46 is a NAND gate and the tri-statable feedback element 47 is a tri-statable inverter. The gate 46 has a first input lead 49, a second input lead 50, and an output lead 51. The tri-statable inverter 47 has an input lead 52 and an output lead 53. The output lead 51 of the gate 46 is coupled to the input lead 52 of the tri-statable inverter 47. The output lead 53 of the tri-statable inverter 47 is coupled to the first input lead 49 of the gate 46. The second input lead 50 of the gate 46 is coupled to receive the internal reset signal RS from the output lead 31 of the inverter 18. An input lead 54 of the tri-statable inverter 48 of the second latch 12 is coupled to the output lead 37 of the inverter 32 of the first latch 11. The output lead 55 of the tri-statable inverter 48 of the second latch 12 is coupled to the first input lead 49 of the gate 46. An input lead 56 of the inverter 58 is coupled to the output lead 51 of the gate 46. An output lead 57 of the inverter 58 is coupled to the data output lead Q 3 of the flip-flop.

In the diagram of FIG. 2, the symbols of some circuit components 13, 18, 46 and 47 are shown in shaded fashion. As indicated by the legend "DENOTES POWERED BY VSUP2" in the diagram, this shading indicates that these components are powered by the second supply voltage VSUP2. The remaining circuit components 14, 17, 15, 34, 33, 32, 35, 48, and 57 that are not shown in shaded fashion as powered by the first supply voltage VSUP1. In the diagram, the first clock signal C is supplied onto all nodes and leads and conductors labeled "C". Similarly, the second clock signal CN is supplied onto all nodes and leads and conductors labeled "CN". Likewise, the internal reset signal RS is supplied onto all nodes and leads and conductors labeled "RS". When the flip-flop is operating in the active state and is not being reset, then the first and second clock signals C and CN clock the first and second latches. For example, if the first clock signal C is a logic low and the second clock signal CN is a logic high, then the first latch is transparent because the tri-statable inverter 35 is enabled and the feedback tri-statable inverter 33 is disabled. The signal on the data input of the first latch is supplied through the first latch to the data output of the first latch. If, however, the first clock signal C is a logic high and the second clock signal CN is a logic low, then the first latch is latched because the tri-statable inverter 35 is disabled and the feedback tri-statable inverter 33 is enabled. The signal on the data input of the first latch is effectively blocked from reaching the node and the input of inverter 32, and the opposite of the logic state on the output lead of the inverter 32 is supplied back onto the input lead 36 by the feedback tri-statable inverter 33. The second latch operates in a similar fashion.

Figure 3:
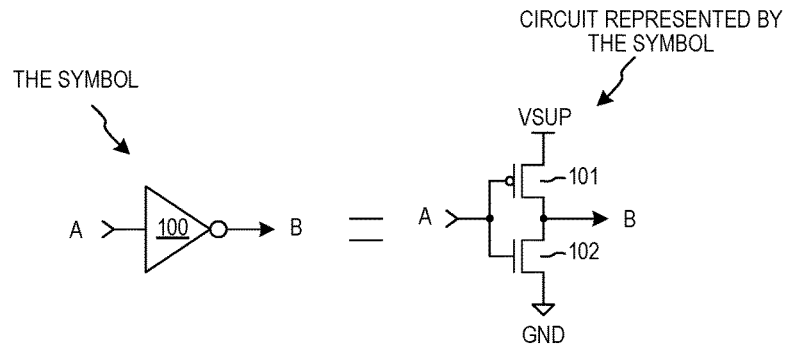
FIG. 3 is a circuit diagram of an inverter.

FIG. 3 is a circuit diagram of an inverter 100. The inverter includes a P-channel transistor 101 and an N-channel transistor 102. Inverters 13, 14, 18, 32, 57 of FIG. 2 are of the construction shown in FIG. 3.

Figure 4:
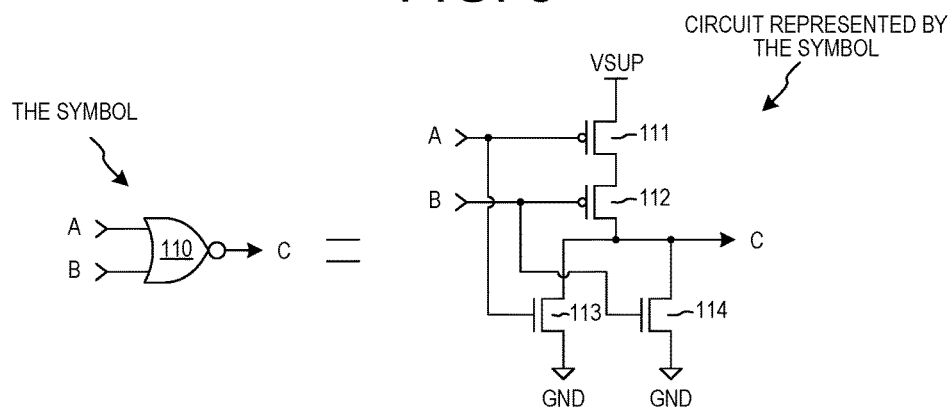
FIG. 4 is a circuit diagram of a NOR gate.

FIG. 4 is a circuit diagram of a NOR gate 110. The NOR gate includes two P-channel transistors 111 and 112 and two N-channel transistors 113 and 114. NOR gate 17 of FIG. 2 is of the construction shown in FIG. 4.

Figure 5:
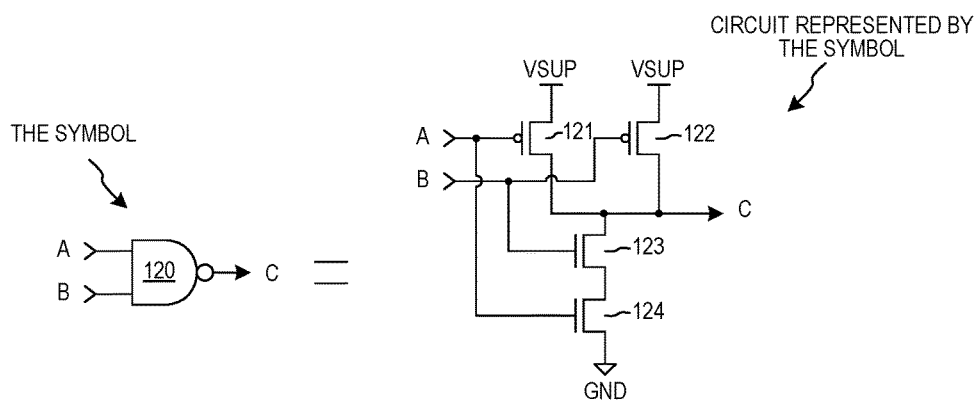
FIG. 5 is a circuit diagram of a NAND gate.

FIG. 5 is a circuit diagram of a NAND gate 120. The NAND gate includes two P-channel transistors 121 and 122 and two N-channel transistors 123 and 124. NAND gate 46 of FIG. 2 is of the construction shown in FIG. 5.

Figure 6:
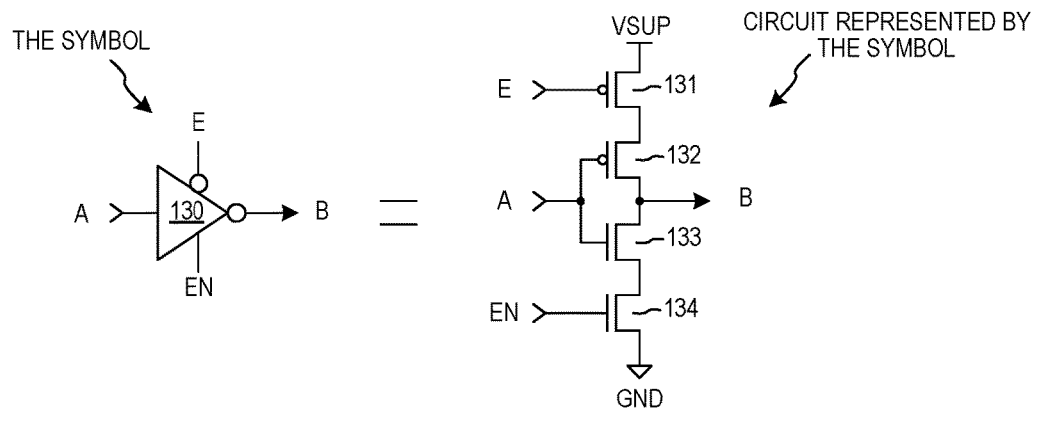
FIG. 6 is a circuit diagram of a tri-statable inverter.

FIG. 6 is a circuit diagram of a tri-statable inverter 130. The tri-statable inverter includes two P-channel transistors 131 and 132 and two N-channel transistors 133 and 134. Tri-statable inverters 47 and 48 of FIG. 2 are of the construction shown in FIG. 6.

Figure 7:
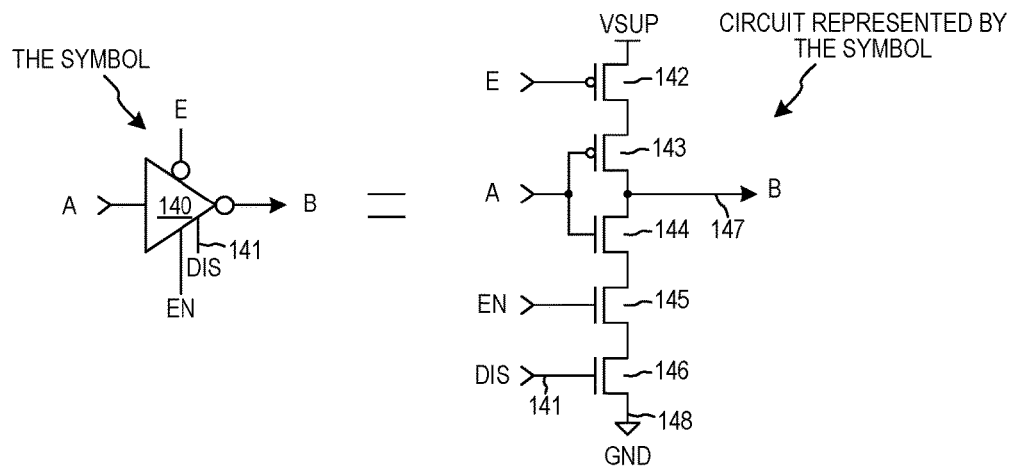
FIG. 7 is a circuit diagram of a tri-statable inverter that has an additional pulldown disable terminal DIS.

FIG. 7 is a circuit diagram of a tri-statable inverter 140 with an additional pulldown disable lead or terminal 141. The tri-statable inverter includes two P-channel transistors 142 and 143 and three N-channel transistors 144-146. A digital logic high signal on the disable lead 141 prevents the tri-statable inverter from coupling the output lead 147 of the tri-statable inverter to the ground lead or terminal 148 of the tri-statable inverter. Tri-statable inverters 33 and 35 of the first latch 11 of FIG. 2 are of the construction shown in FIG. 7.

If flip-flop 1 of FIG. 2 is in the active state and it then experiences a low pulse of the active low reset signal RN, then the internal reset signal RS pulses low. The internal reset signal RS being low causes the pullup P-channel transistor 34 to be turned on, and causes the tri-statable inverters 33 and 35 to be disabled from coupling their output leads to ground. As a consequence, the voltage on the node 149 at the input 36 of the inverter 32 of the first latch 11 is pulled high to a digital logic high level. This is the reset state of the first latch. In the second latch 12, the internal reset signal RS being low causes NAND gate 46 to drive a digital logic high signal onto its output lead 51. Feedback tri-statable inverter 47 is enabled, so the feedback tri-statable inverter drives a digital logic low back onto the first input lead 49 of the NAND gate 46. The second latch 12 is therefore latched in this state so that a digital logic level low is output by inverter 57 onto the Q output lead 3 of the flip-flop. Accordingly, asserting the active low reset signal RN low when the flip-flop is in the active state (VSUP1 and VSUP2 are both being applied and the retention input signal RT is not asserted high) causes the flip-flop to be asynchronously reset.

If VSUP1 and VSUP2 are both being applied to the flip-flop 1 of FIG. 2, but if the active high retention input signal RT is asserted to a digital logic high level, then the digital logic high signal on the first input lead 27 of NOR gate 17 causes internal reset signal RS to be a digital logic high level, regardless of the logic level of the reset input signal RN. Because the internal reset signal RS cannot be a digital logic level low, the flip-flop cannot be reset. Accordingly, when in the retention state, the active low reset RN of the flip-flop 1 of FIG. 2 is disabled.

In the retention state, the flip-flop retains the state it is storing even if the first supply voltage VSUP1 is not being applied. Because the first inverter 13 is powered by the second supply voltage VSUP2, the opposite digital logic level of the incoming clock signal CK is driven onto the output lead 20 of the first inverter 13. In the retention state, however, the pulldown N-channel transistor 15 causes a digital logic low to be present on the input lead 19 of the first inverter 13. The incoming clock signal CK is not being driven by external logic. Because the digital logic level on the input lead of the first inverter 13 is low, the digital logic level of the internal second clock signal CN is driven high by the first inverter. If a digital logic level high is present on the input lead 21 of the second inverter 14, then the N-channel pulldown within the second inverter 14 is on, even though the VSUP1 supply voltage is not being applied to the second inverter 14. This N-channel pulldown transistor within the second inverter 14 being on causes the internal second clock signal C to be pulled down to ground potential. Accordingly, the first clock signal C is pulled to ground potential (a digital logic level low) and the second clock signal C is driven to a digital logic level high. The C and CN signals supplied to the feedback tri-statable inverter 47 of the second latch are at these valid digital logic levels, and the feedback tri-statable inverter 47 is powered by supply voltage VSUP2, so the feedback tri-statable inverter 47 is enabled and operable. The other tri-statable inverter 48 of the second latch, on the other hand, is disabled and is not powered. The feedback tri-statable inverter 47 therefore drives the first input lead 49 of NAND gate 46 and keeps the logic state content of the second latch in the latched state. NAND gate 46 is powered by VSUP2, but the digital logic level of the internal reset signal RS is held at a high digital logic level, so the internal reset signal RS cannot reset the second latch. The internal reset signal RS is guaranteed to be at the high digital logic level because the retention signal RT is a digital logic level high in the retention mode. If the retention signal RT is at the digital logic level high, then a pulldown N-channel transistor within NOR gate 17 is on and conductive, and the NOR gate 17 pulls the voltage on its output lead 29 to ground potential even though NOR gate is not being powered and even if the logic state of the incoming active low reset signal RN is undefined. Because the voltage on the input lead 30 of the inverter 18 is a digital logic low, and because inverter 18 is powered (powered by VSUP2), the inverter 18 drives the internal reset signal RS to the digital logic high level.

FIG. 8 is a table that sets forth characteristics of the flip-flop 1 of FIG. 2. In the active mode, the first and second supply voltages VSUP1 and VSUP2 are supplied onto the flip-flop at a nominal 1.2 volts. In the retention mode, the first supply voltage VSUP1 is not driven to the flip-flop so VSUP1 can drop sown to 50 mV or perhaps down to zero volts. In the retention mode, the second supply voltage is supplied onto the flip-flop at a reduced 0.75 volt level.

Figure 9:
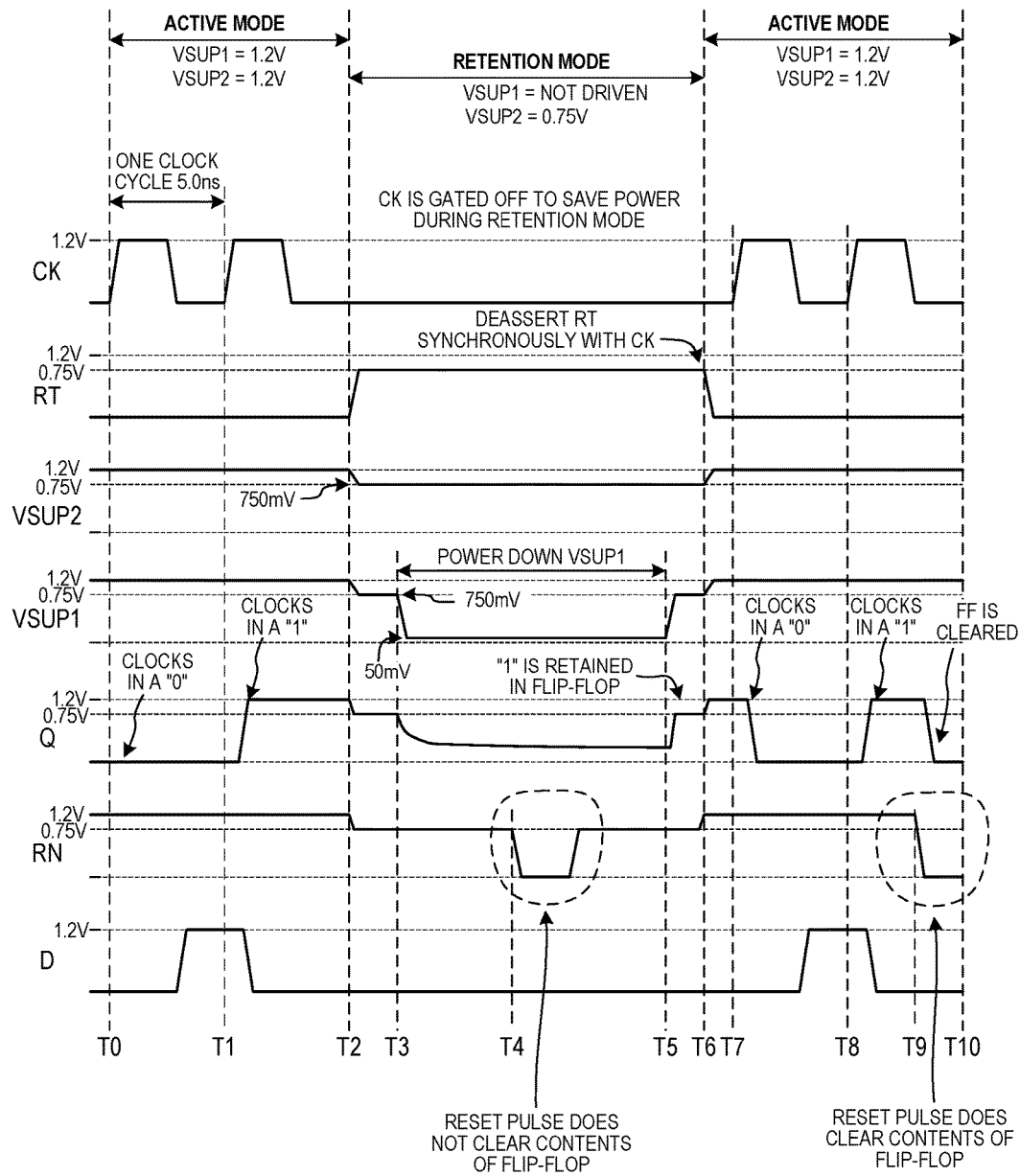
FIG. 9 is a waveform diagram that illustrates an operation of the retention flip-flop 1 of FIG. 2.

FIG. 9 is a waveform diagram that illustrates operation of the flip-flop of FIG. 2. At time T0, the flip-flop is operating in the active state and mode and clocks in a digital logic low ("0") from its D input lead 2. In the active mode, the first and second supply voltages VSUP1 and VSUP2 are supplied to the flip-flop at a nominal 1.2 volts. At time T1, the flip-flop clocks in a digital logic high ("1") from its D input lead 2. At time T2, the first and second supply voltages VSUP1 and VSUP2 are reduced from a nominal 1.2 volts to 0.75 volts, and the retention signal RT on lead 5 is asserted. This puts the flip-flop into the retention mode. The digital logic high output of the flip-flop continues to be driven onto the flip-flop output lead Q 3. At time T3, the first supply voltage VSUP1 is no longer supplied onto the VSUP1 lead and terminal 7 of the flip-flop. The voltages on the internal VSUP1 nodes and conductors inside the flip-flop fall from their reduced supply voltage levels of about 0.75 volts down to about 50 mV. The voltage on data output lead Q 3 therefore decays from its digital logic high value of 0.75 volts because the output inverter 57 of the second latch 12 is no longer powered. From time T3 until time T4, the flip-flop is in its retention state, and it is not being powered by the first supply voltage VSUP1. The second supply voltage VSUP2 of 0.75 volts is, however, still being supplied onto the VSUP2 lead and terminal 8 of the flip-flop so all VSUP2 nodes and conductors inside the flip-flop continue to be powered at 0.75 volts. The clock signal is gated off throughout retention mode operation to save power. In the illustrated example, the external active low reset signal RN is then pulsed low at time T4, but this low pulse does not reset the flip-flop. This is the desired mode of operation of the flip-flop. When in the retention mode, a low pulse on the active low reset input terminal of the flip-flop should not reset or change the state being retained in the flip-flop. Thereafter, in the operational example illustrated by the waveform diagram, the flip-flop is to be taken out of the retention mode. Accordingly, at time T5 the first supply voltage VSUP1 is reapplied to its reduced 0.75 volt level. The second latch, which retained its logic state through the time period from time T2 until time T5, has its output inverter 57 powered again (powered from VSUP1), so the data output lead Q 3 of the flip-flop is again driven with a digital logic high logic level. At time T6, VSUP1 and VSUP2 are increased to their nominal 1.2 volt levels for active mode operation, and the external retention signal RT is no longer asserted (it transitions from a digital logic level high to a digital logic level low). As a result, the flip-flop again operates in its normal active mode. The flip-flop continues to retain the digital logic "1" and continues to output a digital logic high onto its Q output lead 3. This digital logic high value is the last value that was clocked into the flip-flop before the retention mode period of operation. At time T7, the flip-flop clocks in a digital logic low ("0") from its D input lead 2. At time T8, the flip-flop clocks in a digital logic high ("1") from its D input lead 2. Accordingly, from time T6 until time T8, the flip-flop is seen to operate in its normal active state and mode. In the example of FIG. 9, the flip-flop is then to be reset. At time T9, the active low external reset input signal RN on the RN lead and terminal 6 is asserted low. Even though the clock signal CK on lead and terminal 4 is not transitioning low-to-high, the flip-flop is nevertheless asynchronously reset. Note that the digital logic level on the Q output lead 3 of the flip-flop quickly and asynchronously drops from a digital logic high level to a digital logic low level, even though the externally applied clocks signal CK on the CK input lead 4 does not transition.

FIG. 10A through 10D are top-down layout diagrams. Some layers are not shown in these diagrams.

Figure 10A:
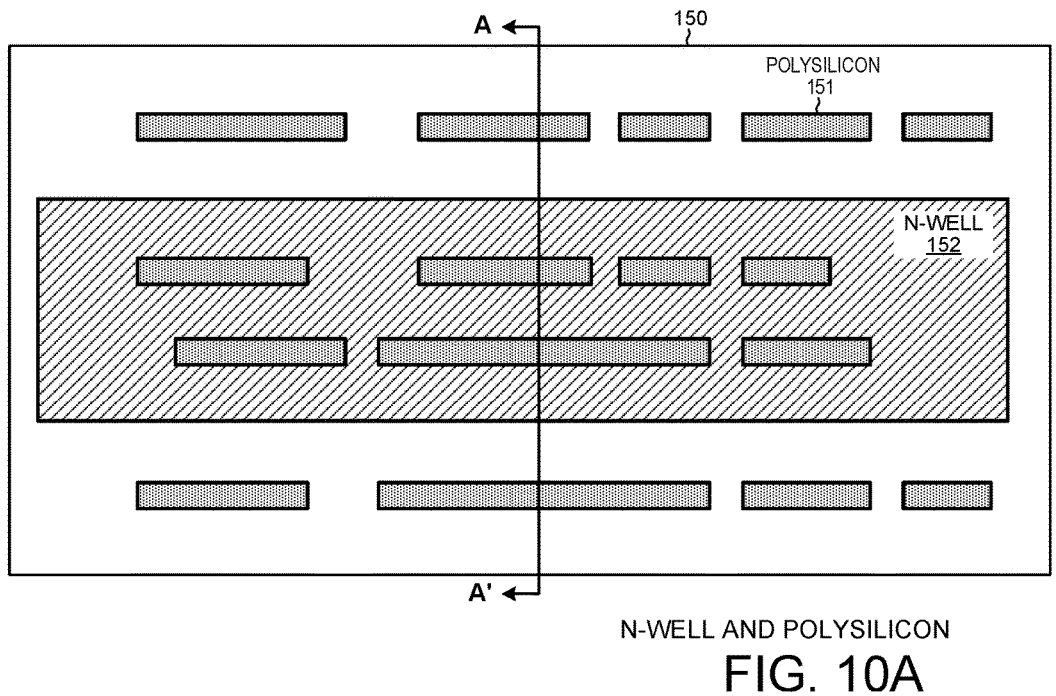
FIG. 10A is a layout diagram of the retention flip-flop 1 of FIG. 2 showing the N-well and the polysilicon features.

FIG. 10A is a top-down layout diagram showing a polysilicon layer of the retention state flip-flop 1 of FIG. 2. Reference numeral 150 identifies the rectangular boundary of the flip-flop. Reference numeral 151 identifies one of several horizontally extending strips of polysilicon. These strips form the polysilicon gates of the various transistors of the flip-flop. Reference numeral 152 identifies the N-well of the flip-flop.

Figure 10B:
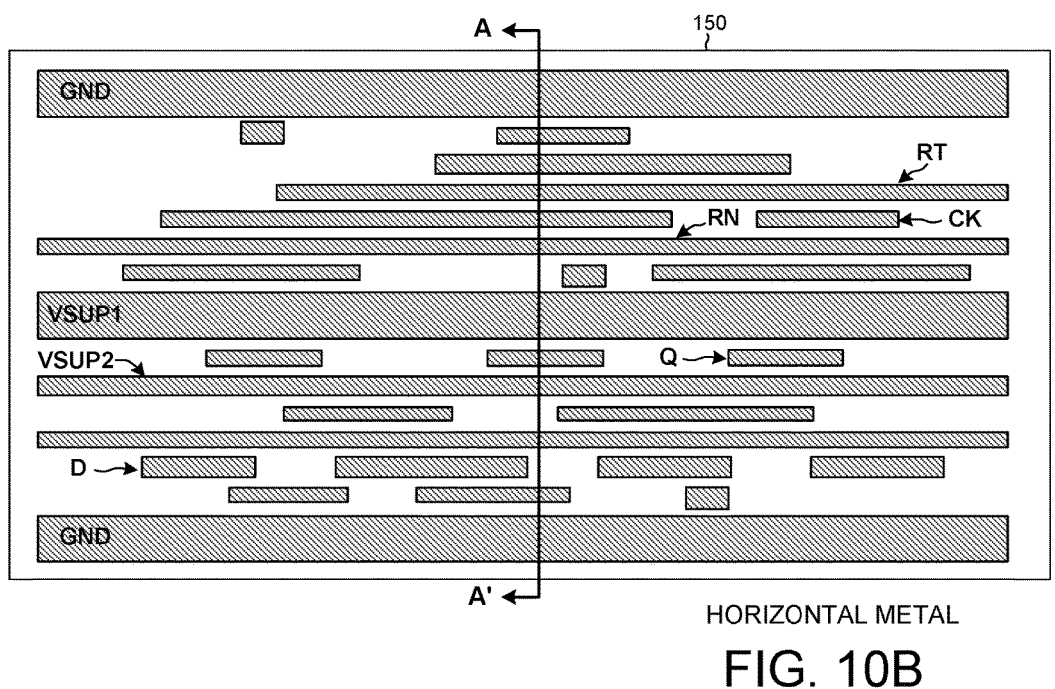
FIG. 10B is a layout diagram of the retention flip-flop 1 of FIG. 2 showing the horizontally-extending features of metallization.

FIG. 10B is a top-down layout diagram showing the features of horizontally extending metallization.

Figure 10C:
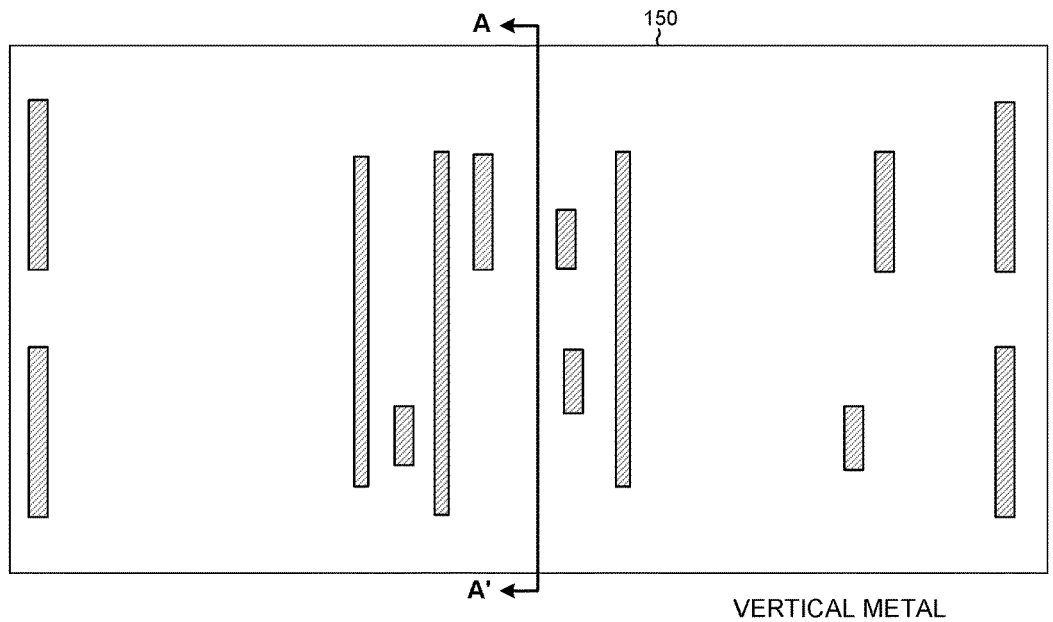
FIG. 10C is a layout diagram of the retention flip-flop 1 of FIG. 2 showing the vertically-extending features of metallization.

FIG. 10C is a top-down layout diagram showing the features of vertically extending metallization.

Figure 10D:
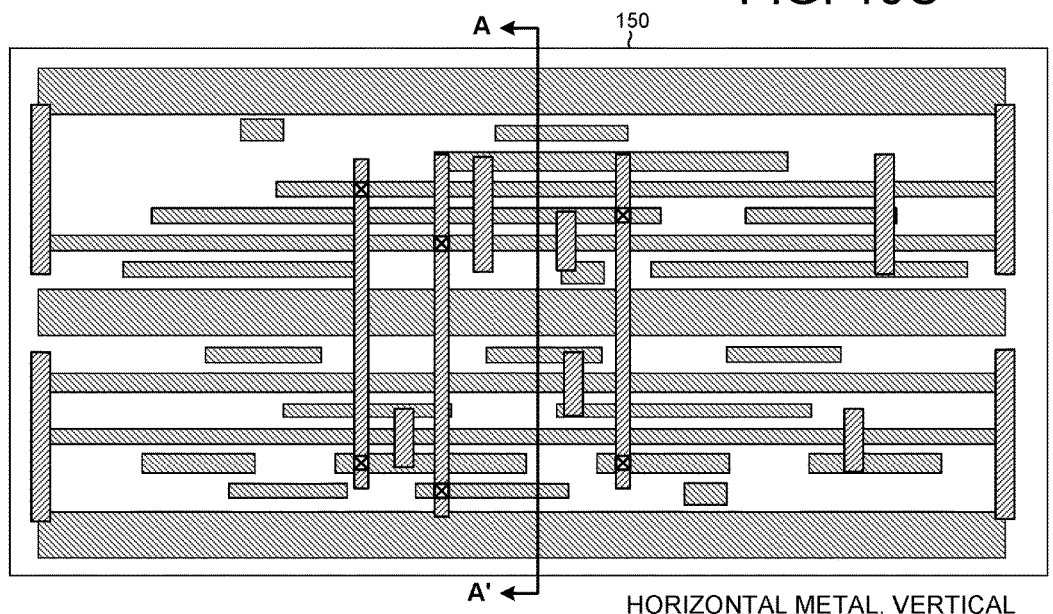
FIG. 10D is a layout diagram of the retention flip-flop 1 of FIG. 2 showing the horizontally-extending features of metallization, the vertically-extending features of metallization, and inter-metal layer vias.

FIG. 10D is a top-down layout diagram that shows the features of horizontally extending metallization, the features of vertically extending metallization, and certain inter-metal layer vias.

Figure 10E:
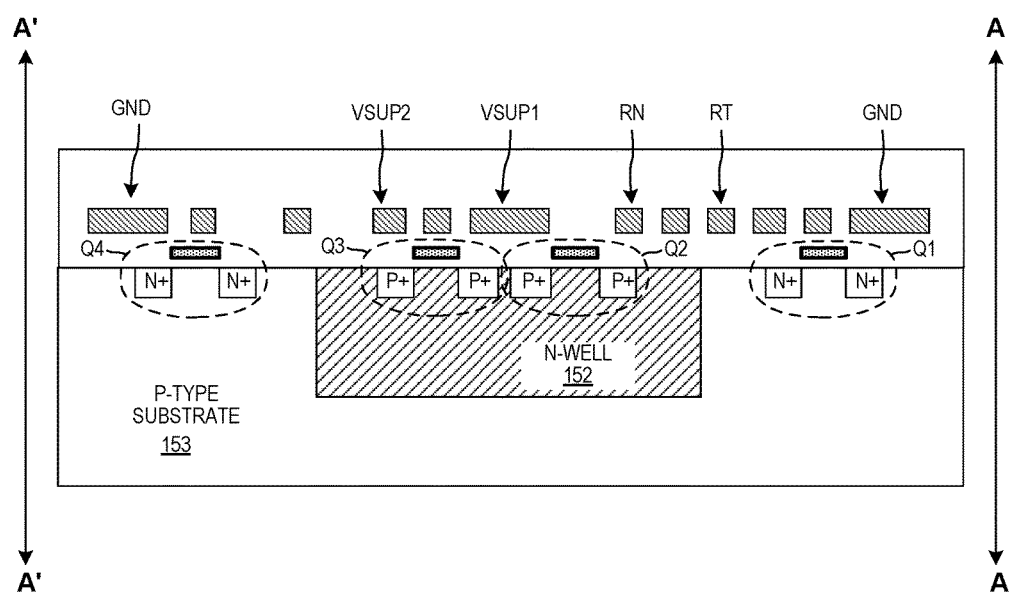
FIG. 10E is a simplified cross-sectional diagram taken along sectional line A-A' of FIG. 10A.

FIG. 10E is a simplified cross-sectional diagram taken along sectional line A-A' of FIG. 10A. In the particular cross-section illustrated, there are four polysilicon gate transistors, denoted Q1, Q2, Q3 and Q4. Transistors Q1 and Q4 are N-channel transistors whereas transistors Q2 and Q3 are P-channel transistors. These four transistors are four of the transistors set forth in FIG. 2 but the four transistors are given different identifiers Q1-Q4 in FIG. 10E. The structure of flip-flop 1, which has a rectangular shape when considered from the top-down perspective, has only one N-well 152. This single N-well 152 extends down into a rectangular area of P-type semiconductor substrate 153 as illustrated in FIG. 10E. The source and drain diffusion regions of all P-channel transistors of the flip-flop 1 extend down into, and are disposed in, this one N-well 152. No P-channel transistor of the flip-flop is disposed outside of this single N-well 152. The reverse bias voltage across the PN junction between the P type semiconductor substrate 153 and the N-well 152 is maintained at about 0.75 volts throughout retention mode flip-flop operation.

Figure 11:
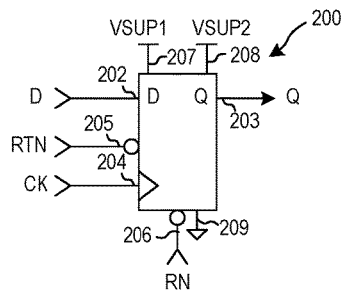
FIG. 11 is a symbol of a state retention flip-flop 200 that has an active low retention signal input RTN and an active low asynchronous reset signal input RN in accordance with another novel aspect.

FIG. 11 is a symbol of a state retention flip-flop 200 having an active low retention signal input RTN and an active low asynchronous reset signal input RN. The symbol has a data input lead and node D 202, a data output lead and node Q 203, a clock signal input lead and node CK 204, an active low retention signal input lead and node RTN 205, an active low asynchronous reset signal input lead and node RN 206, a first supply voltage input lead and node VSUP1 207, a second supply voltage input lead and node VSUP2 208, and a ground lead and node 209. The flip-flop 200 is clocked on the rising edges of a clock signal received on the clock signal input lead CK 204. The flip-flop 200 can be asynchronously reset by applying a logic level low reset signal onto the active low reset signal input lead RN 206 provided that the flip-flop is powered by both the supply voltages VSUP1 and VSUP2 and that the flip-flop is not operating in its retention state. If the flip-flop 200 is fully powered by both VSUP1 and VSUP2 supply voltages and if the retention signal on the RTN input lead 205 is at a digital logic high level, then the flip-flop 200 is said to be in the active state. On the other hand, if the retention signal on the state retention signal input lead RTN 205 is at a digital logic low level, then the flip-flop 200 is in the retention state (is not in the active state). If the flip-flop 200 is in the retention state, then the flip-flop 200 need not be receiving power via the VSUP2 supply voltage input lead 208.

Figure 12:
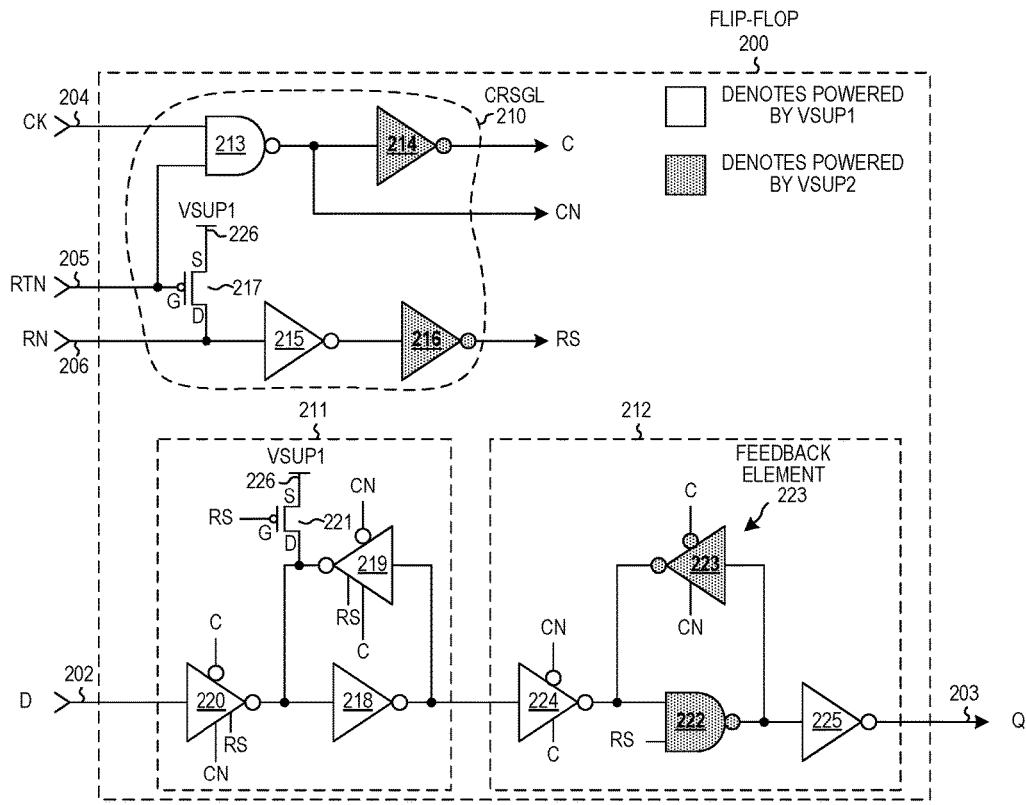
FIG. 12 is a circuit diagram of the retention flip-flop 200 of FIG. 11.

FIG. 12 is a circuit diagram of the retention flip-flop 200. The flip-flop 200 includes "Clock and Reset Signal Generation Logic" (CRSGL) circuit 210, a first latch 211, and a second latch 212. CRSGL circuit 210 includes a NAND gate 213, three inverters 214-216 and a pullup P-channel transistor 217. The first latch 211 includes an inverter 218, two tri-statable inverters 219 and 220, and a P-channel pullup transistor 221. The second latch 212 includes a NAND gate 222, two tri-statable inverters 223 and 224, and an output inverter 225. Inverters 214, 215, 216, 218 and 225 of FIG. 12 are of the construction shown in FIG. 3. NAND gates 213 and 222 of FIG. 12 are of the construction shown in FIG. 5. Tri-statable inverters 223 and 224 of FIG. 12 are of the construction shown in FIG. 6. Tri-statable inverters 219 and 220 of FIG. 12 are of the construction shown in FIG. 7. The circuit components 214, 216, 222 and 223, the symbols of which are shown in in shaded fashion, are powered by the second supply voltage VSUP2. The remaining circuit components 213, 217, 215, 221, 219, 220, 218, 224 and 225 that are not shown in shaded fashion are powered by the first supply voltage VSUP1. The VSUP2 supply voltage node and conductor through which the VSUP2 supply voltage is supplied to the circuitry is not shown in FIG. 12. The ground node and conductor that grounds the various circuit components is not shown in FIG. 12. Reference numeral 226 identifies the VSUP1 supply voltage node and conductor.

The retention flip-flop 200 of FIG. 12 operates as shown in the waveform diagram of FIG. 9, except that the external retention signal that is received onto the RTN lead and terminal 205 is an active low signal. The waveform of the retention signal RTN in the case of the retention flip-flop 200 therefore is the same as the waveform of the signal RT shown in FIG. 9, except that it is of inverted form.

Figure 13:
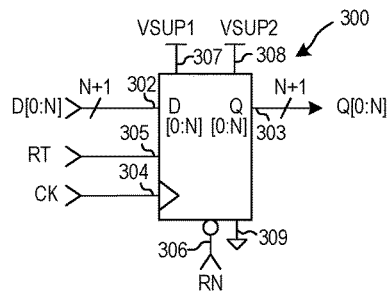
FIG. 13 is a symbol of a multi-bit retention register 300 that has an active high retention signal input terminal RT and an active low reset signal input terminal RN in accordance with another novel aspect.

FIG. 13 is a symbol of a multi-bit retention register 300 that is made up of a common "Clock and Reset Signal Generation Logic" (CRSGL) circuit 310 as well as N+1 retention flip-flop portions denoted 310-0 through 310-N. The symbol has a set of N+1 data input leads D[0:N] 302, a set of N+1 data output leads Q[0:N] 303, a clock signal input lead CK 304, an active high retention signal input lead RT 305, an active low asynchronous reset signal input lead RN 306, a first supply voltage input lead VSUP1 307, a second supply voltage input lead VSUP2 308, and a ground lead 309.

Figure 14:
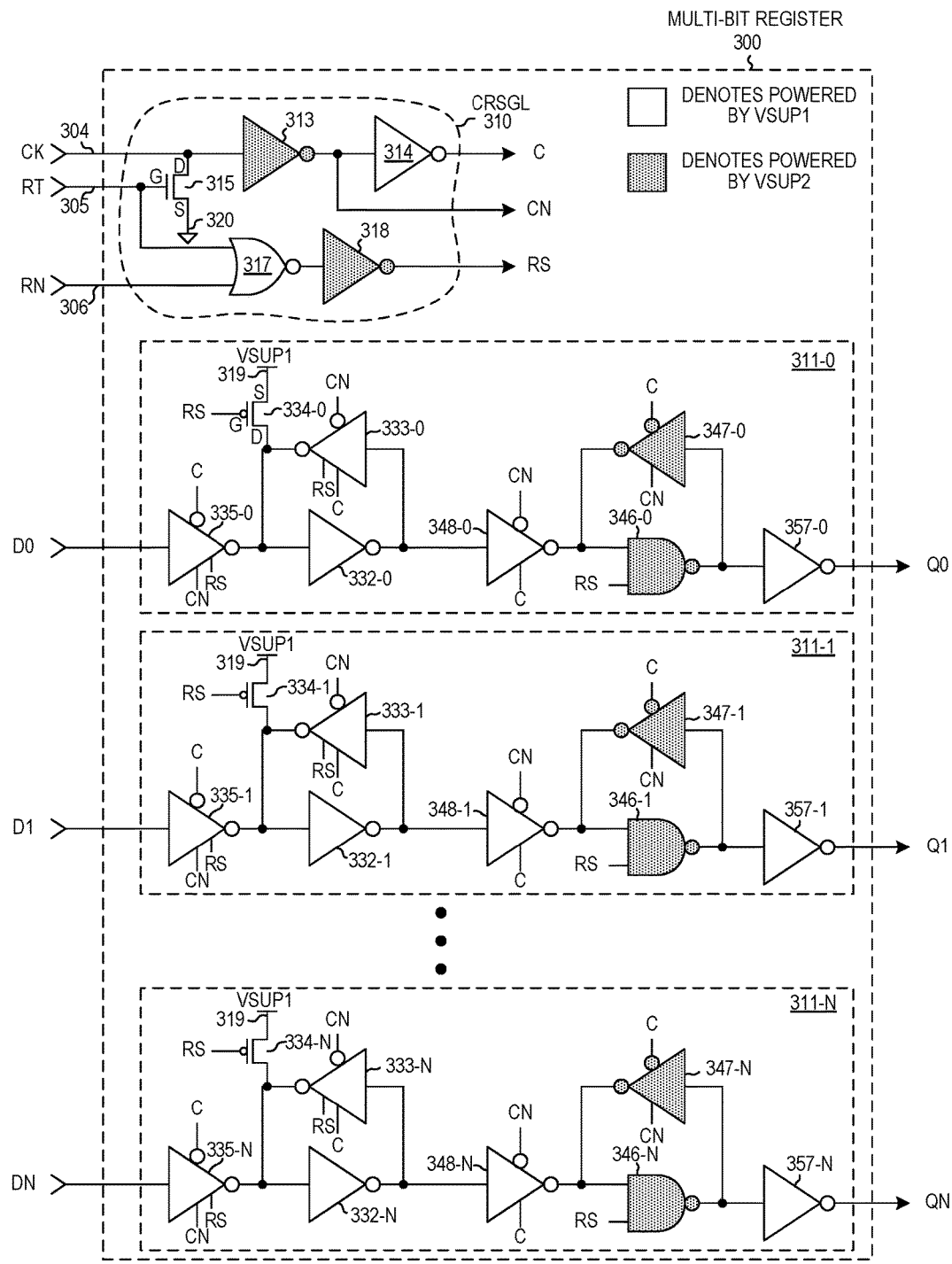
FIG. 14 is a circuit diagram of the multi-bit retention register 300 of FIG. 13.

FIG. 14 is a circuit diagram of the multi-bit retention register 300. Each of the flip-flop portions 310-0 through 310-N is of identical construction. Each consists of two latches, and is of the form of the latches 211 and 212 of FIG. 12. The circuit components 313, 318, 347-0 through 347-N and 346-0 through 346-N, the symbols of which are shown in in shaded fashion, are powered by the second supply voltage VSUP2. The remaining circuit components 314, 315, 317, 334-0 through 334-N, 333-0 through 333-N, 335-0 through 335-N, 332-0 through 332-N, 348-0 through 348-N, and 357-0 through 357-N that are not shown in shaded fashion are powered by the first supply voltage VSUP1. The first clock signal C that is output by inverter 314 is supplied onto all nodes and leads and conductors labeled "C". Similarly, the second clock signal CN that is output by inverter 313 is supplied onto all nodes and leads and conductors labeled "CN". Likewise, the internal reset signal RS that is output by inverter 318 is supplied onto all nodes and leads and conductors labeled "RS". The VSUP2 supply voltage node and conductor through which the VSUP2 supply voltage is supplied to the circuitry is not shown. Reference numeral 319 identifies the VSUP1 supply voltage node and conductor. Reference numeral 320 identifies the ground node and conductor.

Although certain specific embodiments are described above for instructional purposes, the teachings of this patent document have general applicability and are not limited to the specific embodiments described above. The techniques set forth above are usable to realize many different types of sequential logic elements such as falling edge triggered flip-flops, positive and negative level transparent latches, flip-flops and registers having preset and/or parallel load inputs, flip-flops and registers having enable inputs, sequential logic elements having QB outputs as well as Q outputs, sequential logic elements having synchronous reset inputs. Accordingly, various modifications, adaptations, and combinations of various features of the described embodiments can be practiced without departing from the scope of the invention as set forth in the claims.

What is claimed is:

1. A state retention logic circuit comprising:
   a first gate coupled to a clock signal input node and a retention signal input node, and outputting a second clock signal;
   a first inverter coupled to the first gate, and outputting a first clock signal;
   a second inverter coupled to a reset signal input node;
   a third inverter coupled to the second inverter, and outputting a reset signal;
   a pullup P-channel transistor that has a source, a gate and a drain, wherein the source is coupled to a supply voltage node for receiving a first supply voltage, the gate is coupled to the retention signal input node, and the drain is coupled to the reset signal input node;
   a first latch receiving a data signal from a first data input node, wherein the first latch is clocked by the first clock signal and the second clock signal; and
   a second latch coupled to the first latch, and outputting a data signal, wherein the second latch is clocked by the first clock signal and the second clock signal, and the second latch further comprises:
      a second gate having a first input lead, a second input lead, and an output lead; and
      a tri-statable feedback element having an input lead and an output lead, wherein the input lead of the tri-statable feedback element is coupled to the output lead of the second gate, the output lead of the tri-statable feedback element is coupled to the first input lead of the second gate, the tri-statable feedback element is enabled and disabled by the first clock signal and the second clock signal,
   wherein the first inverter, the third inverter, the second gate of the second latch, and the tri-statable feedback element of the second latch are powered by a second supply voltage, and wherein the first latch, the first gate and the second inverter are powered by the first supply voltage.

2. The state retention logic circuit of claim 1, wherein the state retention logic circuit is operable in a retention mode, wherein in the retention mode the first supply voltage may drop to zero volts but yet the first gate that is powered by the first supply voltage nonetheless has an output lead that is coupled to a clock signal input lead of the tri-statable feedback element of the second latch.

3. The state retention logic circuit of claim 1, wherein the reset signal that is output by the third inverter is supplied from the output lead of the third inverter and onto the second input lead of the second gate of the second latch.

4. The state retention logic circuit of claim 1, wherein the second gate of the second latch is a NAND gate, and wherein the tri-statable feedback element of the second latch is a tri-statable inverter.

5. The state retention logic circuit of claim 1, wherein the first latch comprises:
a first tri-statable inverter;
an inverter, wherein an input lead of the inverter of the first latch is coupled to a data signal output lead of the first tri-statable inverter of the first latch;
a second tri-statable inverter, wherein a data signal input lead of the second tri-statable inverter of the first latch is coupled to an output lead of the inverter of the first latch, wherein a data signal output lead of the second tri-statable inverter of the first latch is coupled to the data output lead of the first tri-statable inverter of the first latch; and
a pullup P-channel transistor having a source coupled to the supply voltage node, and having a drain coupled to the data signal output lead of the second tri-statable inverter of the first latch, and having a gate coupled to receive the reset signal from the third inverter, wherein if the reset signal is at a digital logic level low then the pullup P-channel transistor of the first latch is on and the first and second tri-statable inverters of the first latch are disabled.

6. The state retention logic circuit of claim 5, wherein the first tri-statable inverter of the first latch includes no more than two P-channel transistors, wherein the second tri-statable inverter of the first latch includes no more than two P-channel transistors, and wherein the pullup P-channel transistor of the first latch is the only P-channel transistor of the first latch whose gate is coupled to receive the reset signal.

7. The state retention logic circuit of claim 1, wherein the state retention logic circuit is a multi-bit register, and wherein the state retention logic circuit further comprises:
a third latch coupled to a second data input node and receiving a data signal, wherein the third latch is clocked by the first clock signal and the second clock signal; and
a fourth latch coupled to the third latch, wherein an output lead of the fourth latch is coupled to output a data signal onto a second data output node, and wherein the fourth latch is clocked by the first clock signal and the second clock signal.

8. The state retention logic circuit of claim 1, wherein the state retention logic circuit includes one and only one N-well, wherein each of the first inverter, the second inverter, the gate circuit, the first latch, and the second latch includes at least one P-channel transistor, and wherein the P-channel transistors of the state retention logic circuit are disposed in the one and only one N-well.

9. A state retention logic circuit comprising:
a first gate coupled to a clock signal input node and a retention signal input node, and outputting a second clock signal;
a first inverter coupled to the first gate, and outputting a first clock signal;
a second inverter coupled to a reset signal input node;
a third inverter coupled to the second inverter, and outputting a reset signal;
a pullup P-channel transistor that has a source, a gate and a drain, wherein the source is coupled to a supply voltage node, the drain is coupled to the reset signal input node, and the gate is coupled to the retention signal input node;
a first latch receiving a data signal from a first data input node, wherein the first latch is clocked by the first clock signal and the second clock signal; and
a second latch coupled to the first latch, and outputting a data signal, wherein the second latch is clocked by the first clock signal and the second clock signal, and the second latch further comprises:
a second gate having a first input lead, a second input lead coupled to receive the reset signal from the third inverter, and an output lead; and
a tri-statable feedback element having an input lead and an output lead, wherein the input lead of the tri-statable feedback element is coupled to the output lead of the second gate, the output lead of the tri-statable feedback element is coupled to the first input lead of the second gate, and the tri-statable feedback element is enabled and disabled by the first clock signal and the second clock signal,
wherein the first inverter, the third inverter, the second gate of the second latch, and the tri-statable feedback element of the second latch are powered by a second supply voltage, and wherein the first latch, the first gate and the second inverter are powered by a first supply voltage.

10. The state retention logic circuit of claim 9, wherein the state retention logic circuit is operable in a retention mode, wherein in the retention mode the first supply voltage has a positive voltage that is lower than the second supply voltage.

* * * * *